US012279405B2

(12) United States Patent
Lee

(10) Patent No.: US 12,279,405 B2
(45) Date of Patent: Apr. 15, 2025

(54) MAGNETIC FIELD SHIELDING SHEET AND MANUFACTURING METHOD THEREFOR

(71) Applicant: AMOSENSE CO., LTD, Cheonan-si (KR)

(72) Inventor: Dong Hoon Lee, Cheonan-si (KR)

(73) Assignee: AMOSENSE CO., LTD, Cheonan-si (KR)

( * ) Notice: Subject to any disclaimer, the term of this patent is extended or adjusted under 35 U.S.C. 154(b) by 67 days.

(21) Appl. No.: 18/285,269

(22) PCT Filed: Mar. 31, 2022

(86) PCT No.: PCT/KR2022/004635
§ 371 (c)(1),
(2) Date: Oct. 2, 2023

(87) PCT Pub. No.: WO2022/211545
PCT Pub. Date: Oct. 6, 2022

(65) Prior Publication Data
US 2024/0188265 A1 Jun. 6, 2024

(30) Foreign Application Priority Data
Apr. 2, 2021 (KR) .......... 10-2021-0043516

(51) Int. Cl.
*H05K 9/00* (2006.01)
*H01F 41/14* (2006.01)

(52) U.S. Cl.
CPC .......... *H05K 9/0075* (2013.01); *H01F 41/14* (2013.01)

(58) Field of Classification Search
CPC .................................................. H05K 9/0075
See application file for complete search history.

(56) References Cited

U.S. PATENT DOCUMENTS

| 2016/0055952 A1* | 2/2016 | Watanabe | H01F 10/26 |
| | | | 156/193 |
| 2018/0315534 A1* | 11/2018 | Jang | H02J 50/70 |
| 2019/0148988 A1* | 5/2019 | Hwang | H01Q 1/526 |
| | | | 307/104 |

(Continued)

FOREIGN PATENT DOCUMENTS

| JP | 4927625 B2 | 5/2012 |
| KR | 20170067635 A | 6/2017 |

(Continued)

*Primary Examiner* — Hung V Ngo
(74) *Attorney, Agent, or Firm* — Gokalp Bayramoglu

(57) ABSTRACT

Provided are a magnetic field shielding sheet and a manufacturing method therefor. The magnetic field shielding sheet includes: a sheet main body formed from a magnetic material to be capable of shielding a magnetic field; a first protection layer disposed to cover one surface of the sheet main body; a second protection layer disposed to cover the other surface, opposite from the one surface, of the sheet main body; a third protection layer interposed between the first protection layer and the second protection layer to cover the side surface of the sheet main body in the thickness direction of the sheet main body; and a sealing part formed on the side portion of the sheet main body so that the sheet main body is sealed, wherein a stepped portion formed between the sheet main body and the sealing part is reduced by means of the third protection layer.

18 Claims, 12 Drawing Sheets

(56) References Cited

U.S. PATENT DOCUMENTS

| | | | |
|---|---|---|---|
| 2019/0259526 A1* | 8/2019 | Cho | H01F 27/29 |
| 2021/0227730 A1* | 7/2021 | Ohkoshi | B32B 27/38 |
| 2021/0360839 A1* | 11/2021 | Yamada | H05K 9/0088 |
| 2022/0007555 A1* | 1/2022 | Ishihara | B32B 27/14 |
| 2023/0238702 A1* | 7/2023 | Jang | H01Q 7/00 |
| | | | 343/702 |

FOREIGN PATENT DOCUMENTS

| | | |
|---|---|---|
| KR | 20200032991 A | 3/2020 |
| KR | 102122392 B1 | 6/2020 |
| KR | 20200073100 A | 6/2020 |

* cited by examiner

160 : 161, 162

S10

```
ARRANGE SHEET MAIN BODY ON
BASE SUBSTRATE                    — S11
        ↓
ARRANGE THIRD SEALANT ON
BASE SUBSTRATE                    — S12
        ↓
BLANK AND REMOVE PORTION OF
THIRD SEALANT ADJACENT TO         — S13
SHEET MAIN BODY
        ↓
ARRANGE FIRST SEALANT ON SHEET
MAIN BODY AND THIRD SEALANT       — S14
        ↓
REMOVE BASE SUBSTRATE AND
ARRANGE SECOND SEALANT            — S15
        ↓
BLANK FIRST AND SECOND
SEALANTS ACCORDING TO             — S16
DESIGN STANDARD
```

FIG. 8

MAGNETIC FIELD SHIELDING SHEET AND MANUFACTURING METHOD THEREFOR

CROSS REFERENCE TO THE RELATED APPLICATIONS

This application is the national phase entry of International Application No. PCT/KR2022/004635, filed on Mar. 31, 2022, which is based upon and claims priority to Korean Patent Application No. 10-2021-0043516, filed on Apr. 2, 2021, the entire contents of which are incorporated herein by reference.

TECHNICAL FIELD

The present invention relates to a magnetic field shielding sheet and a method of manufacturing the same.

BACKGROUND

Near field communication (NFC) and wireless charging are essentially non-contact transmission methods. Such a non-contact transmission method is implemented through an antenna that transmits or receives a magnetic field, and a magnetic field shielding sheet disposed on one surface of the antenna to smoothly transmit or receive the magnetic field.

Typically, sheets made of a magnetic material such as amorphous ribbon sheets, ferrite sheets, or polymer sheets are used as magnetic field shielding sheets. Meanwhile, a magnetic field shielding sheet requires a protective film in the form that seals a sheet main body to protect the sheet main body made of a magnetic material from external environmental factors such as temperature, humidity, and unavoidable external forces.

In the case of a related art, a pair of protective films each having a relatively larger area than a sheet main body are disposed on an upper portion and a lower portion of the sheet main body, and then outer edges of the pair of protective films are bonded to each other to form a sealing portion.

However, in this case, in order for a pair of protective films to form a sealing portion, the protective film is deformed due to a step difference due to the thickness of a sheet main body. Therefore, when the thickness of the sheet main body is greater than or equal to a certain range, the protective film forms a steep slope in proportion to the thickness and is excessively deformed, which causes a problem that a desired level of sealing force cannot be secured.

As a workaround to prevent such excessive deformation, there is a method of expanding the area of a protective film to form a sealing portion such that the protective film forms a gentle slope. However, in this case, there is a problem that the size of a finally commercialized magnetic field shielding sheet becomes large. Such an enlarged magnetic field shielding sheet is difficult to apply to products aimed at miniaturization and thinning.

SUMMARY

Technical Problem

The present invention is directed to providing a magnetic field shielding sheet that may be miniaturized by minimizing the area of a protective film surrounding a sheet main body, and a method of manufacturing the same.

The present invention is also directed to providing a magnetic field shielding sheet in which the excessive deformation of a protective film surrounding a sheet main body may be prevented, and also a sealing force of the protective film may be improved, and a method of manufacturing the same.

The present invention is also directed to providing a magnetic field shielding sheet which can ensure an excellent sealing force even for a sheet main body having a thick thickness only with a protective film having a limited area, and a method of manufacturing the same.

Technical Solution

One aspect of the present invention provides a magnetic field shielding sheet including a sheet main body made of a magnetic material to shield a magnetic field, a first protective layer disposed to cover one surface of the sheet main body, a second protective layer disposed to cover the other surface which is opposite to the one surface of the sheet main body, a third protective layer interposed between the first protective layer and the second protective layer to cover a side surface of the sheet main body in a thickness direction of the sheet main body, and a sealing portion formed at a side portion of the sheet main body to seal the sheet main body, wherein a step difference formed between the sheet main body and the sealing portion is formed to be alleviated by the third protective layer.

The third protective layer includes a hollow portion formed for the sheet main body to be disposed in an inner region thereof.

The hollow portion may be formed in a shape corresponding to a shape of the sheet main body, and a certain interval may be formed between the side surface of the sheet main body and a boundary surface of the hollow portion.

The certain interval may be in a range of 100 μm to 200 μm.

The first to third protective layers may be stacked such that outer edges are not misaligned with each other in a thickness direction.

The sealing portion may include a first sealing portion formed by a portion of the first protective layer and a portion of the third protective layer being in contact with each other, and a second sealing portion formed by a portion of the second protective layer and another portion of the third protective layer being in contact with each other.

The sealing portion may include a third sealing portion formed by a portion of the first protective layer and a portion of the second protective layer being in contact with each other outside the third protective layer, and the sheet main body and the third protective layer may be sealed by the third sealing portion to not be exposed to the outside.

A thickness of the third protective layer may be less than a thickness of the sheet main body.

A first step difference may be formed between a first region in which the first protective layer is in contact with the sheet main body and a second region in which the first protective layer is in contact with the third protective layer.

A second step difference may be formed between the second region and a third region in which the first protective layer is in contact with the second protective layer.

A thickness of the third protective layer may be equal to a thickness of the sheet main body, and the first protective layer and the second protective layer may be disposed parallel to each other.

The third protective layer may be disposed to cover only a partial side surface of an entire side surface of the sheet main body.

Another aspect of the present invention provides a magnetic field shielding sheet including a sheet main body made of a magnetic material to shield a magnetic field, a first protective layer disposed to cover one surface of the sheet main body, a second protective layer disposed to cover the other surface which is opposite to the one surface of the sheet main body, a third protective layer which includes a hollow portion formed for the sheet main body to be disposed in an inner region thereof, covers a side surface of the sheet main body, and is interposed between the first protective layer and the second protective layer, and a sealing portion formed on a side portion of the sheet main body to seal the sheet main body, wherein a thickness of the third protective layer is less than or equal to a thickness of the sheet main body, and a step difference formed between the sheet main body and the sealing portion is formed to be alleviated by the third protective layer.

Still another aspect of the present invention provides a method of manufacturing a magnetic field shielding sheet including a first protective layer and a second protective layer, each surrounding the sheet main body, and a third protective layer between the first protective layer and the second protective layer including a first operation of arranging one or more sheet main bodies on a base substrate having a plate shape, a second operation of arranging a third sealant for forming the third protective layer on the base substrate such that the one or more sheet main bodies are embedded, a third operation of removing one region of the third sealant adjacent to the one or more sheet main bodies, a fourth operation of arranging a first sealant for forming the first protective layer on the one or more sheet main bodies and the third sealant, and a fifth operation of removing the base substrate and arranging a second sealant for forming the second protective layer in place of the base substrate.

The first sealant may be formed as a protective film with an adhesive applied on one surface, and the second sealant may be formed as a protective film with an adhesive applied on two surfaces.

The method may further include, after the first operation, arranging a removable release film on the sheet main body.

The third operation may include performing blanking with a mold including a cutting blade having a hollow portion with a shape corresponding to the sheet main body, and an area of the hollow portion may be greater than an area of the sheet main body such that the cutting blade is spaced apart from the sheet main body by a certain interval.

The method may further include a sixth operation of blanking the first sealant and the second sealant according to a certain design standard of a magnetic field shielding sheet in a state in which the first sealant and the second sealant are disposed.

Advantageous Effects

According to the present invention, since a third protective layer is introduced to thus form a sealing portion at a portion of the third protective layer, a step difference between a sheet main body and the sealing portion can be alleviated, thereby securing an excellent sealing force only with first and second protective layers with relatively small areas.

According to the present invention, through a third protective layer, a step difference due to the thickness of a sheet main body can be divided into a first step difference and a second step difference and accommodated step by step, thereby minimizing the deformation of first and second protective layers to manufacture a miniaturized magnetic field shielding sheet.

BRIEF DESCRIPTION OF THE DRAWINGS

FIG. 8 is a flowchart illustrating a method of manufacturing a magnetic field shielding sheet according to one embodiment of the present invention.

DETAILED DESCRIPTION OF THE EMBODIMENTS

Figure 1:
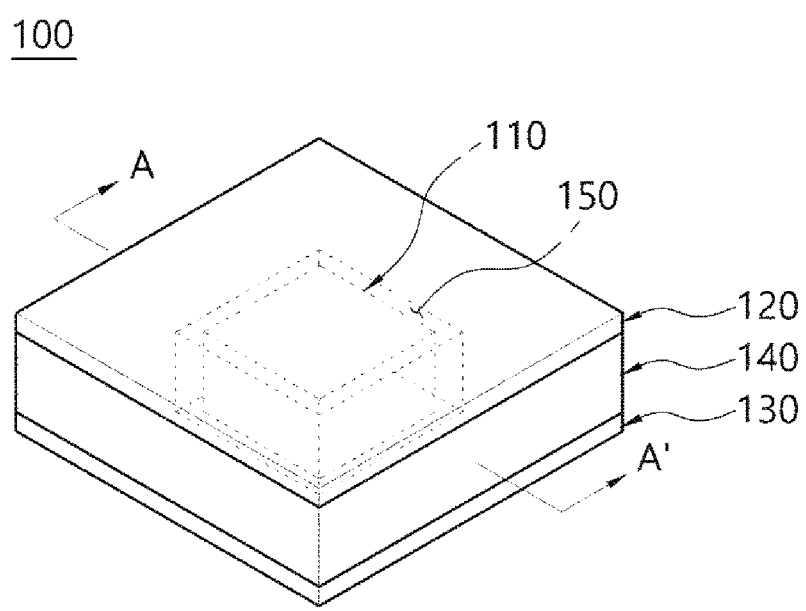
FIG. 1 is a view illustrating a magnetic field shielding sheet according to one embodiment of the present invention.

Hereinafter, embodiments of the present invention will be described in detail with reference to the accompanying drawings so as to be easily practiced by a person of ordinary skill in the art to which the present invention pertains. It should be understood that the present invention may be embodied in various different forms and is not limited to the following embodiments. Parts irrelevant to description are omitted from the drawings in order to clearly describe the present invention, and like reference numerals refer to like elements throughout the specification. The sizes or shapes of elements and the like shown in the drawings may be exaggerated for clarity and convenience's sake.

A magnetic field shielding sheet 100, 100', or 200 according to one embodiment of the present invention may be disposed on one surface of an antenna unit to shield a magnetic field generated from the antenna unit and also focus the magnetic field in a desired direction.

To this end, as shown in FIG. 1, the magnetic field shielding sheet 100, 100', or 200 according to one embodiment of the present invention may include a sheet main body 110, a first protective layer 120, a second protective layer 130, and a third protective layer 140.

The sheet main body 110 may be made of a magnetic material to shield a magnetic field generated from at least one antenna unit.

Herein, the antenna unit may be, for example, a flat coil in which a conductive member having a certain wire diameter is wound multiple times or may be an antenna pattern formed in a pattern on one surface of a circuit board.

In addition, the antenna unit may be a wireless power transfer antenna that transmits or receives wireless power, a magnetic secure transmission (MST) antenna for magnetic payment, or a near field communication (NFC) antenna for short-distance communication. Furthermore, the antenna unit may be provided as a combo-type including two or more of the above-described wireless power transfer antenna, MST antenna, and NFC antenna.

In this case, the sheet main body 110 may be made of a material including a metal component.

As an example, the sheet main body 110 may be a ribbon sheet including at least one of an amorphous alloy and a nanocrystalline alloy. However, the material of the sheet main body 110 is not limited thereto, and any known material used for a magnetic field shielding sheet, such as ferrite, a polymer, or a permalloy, may be used.

In one embodiment of the present invention, the sheet main body 110 may be formed as a single-layer ribbon sheet, may be a multi-layer sheet in which a plurality of ribbon sheets are stacked in multiple layers through an adhesive layer, or may be a hybrid sheet in which an amorphous alloy ribbon sheet and a nanocrystalline alloy ribbon sheet are combined.

Figure 2:
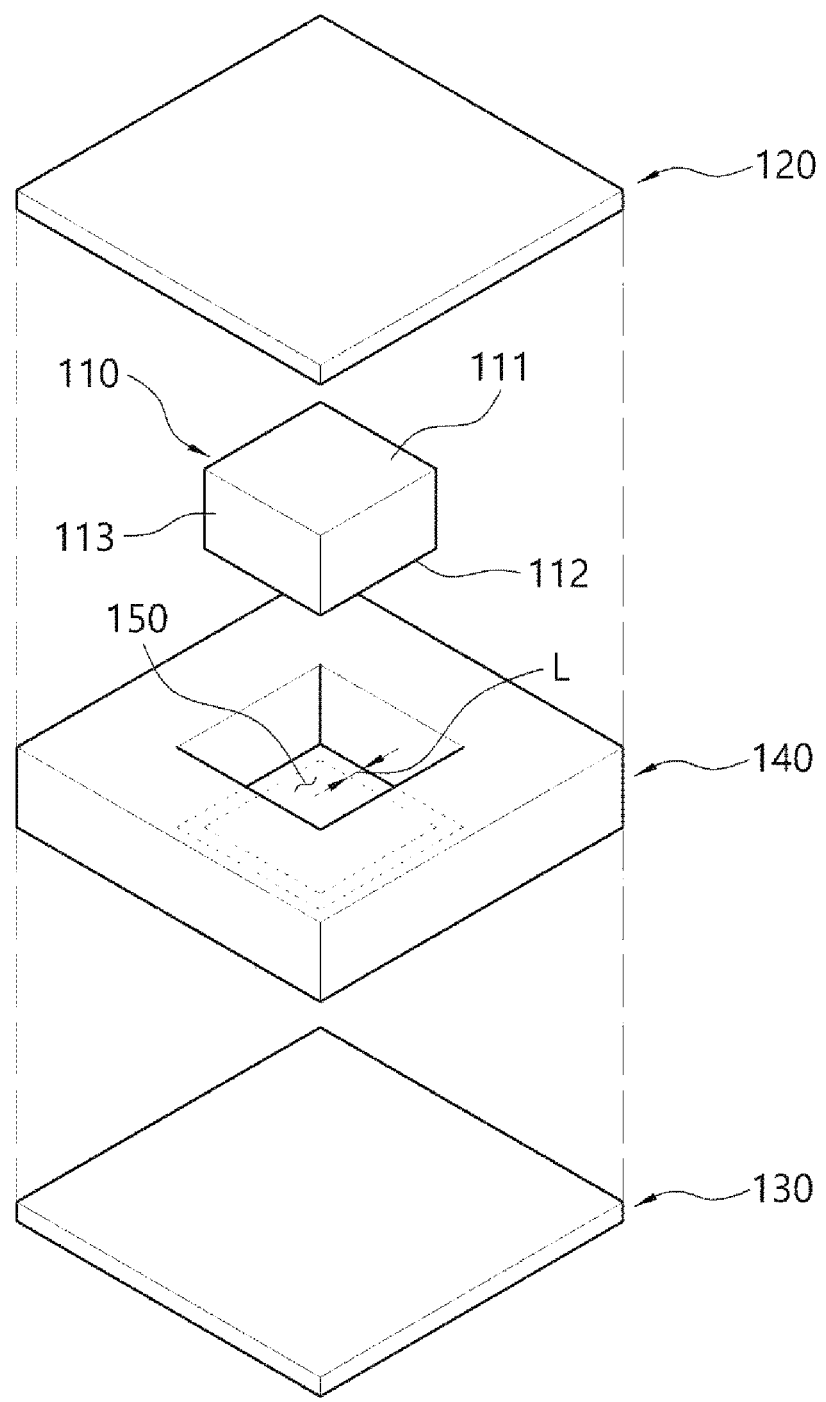
FIG. 2 is an exploded view of FIG. 1.

Meanwhile, as shown in FIG. 2, the sheet main body 110 may be formed in a plate shape including an upper surface 111, a lower surface 112, and a side surface 113 connecting the upper surface 111 and the lower surface 112. In the drawing, the sheet main body 110 is shown as having a hexahedral shape, but the shape of the sheet main body 110 is not limited thereto. The sheet main body 110 may be formed, for example, in various shapes such as a disk shape.

The magnetic field shielding sheet 100, 100', or 200 according to one embodiment of the present invention may include the first protective layer 120 disposed to cover one surface of the sheet main body 110.

In one embodiment of the present invention, the first protective layer 120 may be formed in the form of a plate-shaped film having a certain thickness.

As a non-limiting example, the first protective layer 120 may be a fluororesin-based film such as a polyethylene terephthalate (PET) film, a polyimide film, a polyester film, a polyphenyline sulfide (PPS) film, a polypropylene (PP) film, or a polyterephthalate (PTFE) film. However, the present invention is not limited to this, and the first protective layer 120 may be formed as various other known films.

Thus, the first protective layer 120 may seal the sheet main body 110 together with the second protective layer 130 and the third protective layer 140 which will be described below, thereby performing a function of protecting the sheet main body 110 from being exposed directly to various external environmental factors such as external force or moisture.

In addition, as shown in FIGS. 3A-3C and 6, the first protective layer 120 may be in contact with a portion of the second protective layer 130 or the third protective layer 140 in addition to the sheet main body 110.

In this case, step differences D1 and D2 with certain heights may be present between the sheet main body 110, the second protective layer 130, and the third protective layer 140. In order to respond to these step differences D1 and D2, the first protective layer 120 may be made a flexible material.

In one embodiment of the present invention, the first protective layer 120 may be disposed to be attached to one surface of the sheet main body 110 through a first adhesive layer 124.

As an example, the first adhesive layer 124 may be made of a conductive adhesive, an insulating adhesive, an acrylic-based adhesive, or the like. The first adhesive layer 124 may be attached to the sheet main body 110 while pre-disposed on one surface of the first protective layer 120.

The first adhesive layer 124 may also be attached to a portion of the second protective layer 130 or the third protective layer 140 in addition to the sheet main body 110. Thus, the first adhesive layer 124 may bond the second protective layer 130 and the first protective layer 120 or may bond the third protective layer 140 and the first protective layer 120 and may form a sealing portion 160 to be described below.

Hereinafter, as described above, a region of the first protective layer 120 which is in contact with the sheet main body 110 is defined as a first region 121, and a region of the first protective layer 120 which is in contact with the third protective layer 140 is defined as a second region 122. A region of the first protective layer 120 which is in contact with the second protective layer 130 is defined as a third region 123.

The magnetic field shielding sheet 100, 100', or 200 according to one embodiment of the present invention may include the second protective layer 130 disposed to cover the other surface 112 of the sheet main body 110.

In this case, the second protective layer 130 may be formed in the form of a film having a certain thickness similar to the first protective layer 120 and may be disposed on the other surface 112 of the sheet main body 110 to perform a function of protecting the sheet main body 110.

Herein, since the second protective layer 130 differs from the first protective layer 120 only in arrangement position and is substantially similar to the first protective layer 120 in function and effect, redundant descriptions will be replaced with the descriptions of the first protective layer 120, and differences will be mainly described.

In one embodiment of the present invention, as shown in FIGS. 3A-3C and 6, the second protective layer 130 may be disposed to be attached to the other surface 112 opposite to one surface 111 of the sheet main body through a second adhesive layer 134.

In this case, like the first adhesive layer 124, the second adhesive layer 134 may also be attached to a portion of the second protective layer 130 or the third protective layer 140 in addition to the sheet main body 110 while entirely applied on one surface of the second protective layer 130.

Thus, the second adhesive layer 134 may bond the second protective layer 130 and the first protective layer 120 or may bond the third protective layer 140 and the first protective layer 120 to form the sealing portion 160.

The magnetic field shielding sheet 100, 100', or 200 according to one embodiment of the present invention may include the third protective layer 140 disposed to cover the side surface 113 of the sheet main body 110.

In this case, like the first protective layer 120 and the second protective layer 130, the third protective layer 140 may be made of a fluororesin-based material such as a polyethylene terephthalate (PET), a polyimide, a polyester, a polyphenyline sulfide (PPS), a polypropylene (PP), or a polyterephthalate (PTFE). However, the above-described materials are merely examples of the material for forming the third protective layer 140, and in addition, various materials having durability and chemical resistance may be used to effectively protect the sheet main body 110.

Figure 5:
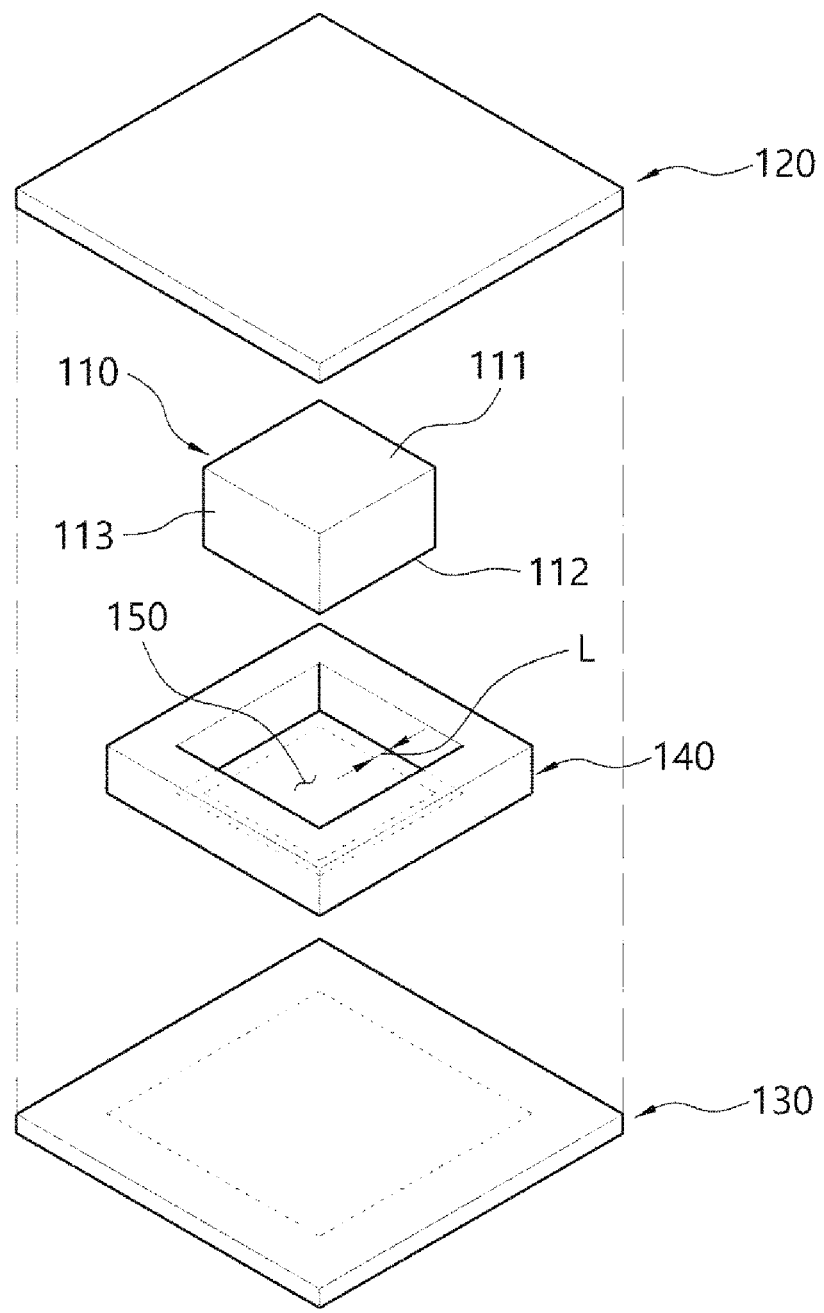
FIG. 5 is an exploded view of FIG. 4.

In one embodiment of the present invention, as a non-limiting example, as shown in FIGS. 2 and 5, the third protective layer 140 may be formed in a plate shape and may include a hollow portion 150 for the sheet main body 110 to be disposed in an inner region thereof.

In this case, the hollow portion 150 may be formed in a shape corresponding to a shape of the sheet main body 110 to pass through a portion of the third protective layer 140.

Thus, the hollow portion 150 may sufficiently cover the side surface 113 of the sheet main body which is dispose therein.

Preferably, the sheet main body 110 may be disposed to be spaced apart from a boundary surface of the hollow portion 150. That is, as shown in FIGS. 3A-3C and 6, a certain interval L may be formed between the boundary surface of the hollow portion 150 and the side surface 113 of the sheet main body.

Thus, in the magnetic field shielding sheets 100, 100', and 200 according to one embodiment of the present invention, when the third protective layer 140 is disposed adjacent to the sheet main body 110, a sufficient spare space may be secured to prevent the sheet main body 110 and the third protective layer 140 from being disposed to overlap each other.

In this case, the certain interval L may be in a range of 100 μm to 200 μm.

When the certain interval L exceeds 200 μm, a space between the sheet main body 110 and the third protective layer 140 becomes large, which has a disadvantage of making it difficult to sufficiently support the sheet main body 110. On the other hand, when the certain interval L is less than 100 μm, there is a disadvantage in that it is difficult to secure a manufacturing tolerance of the magnetic field shielding sheet. Therefore, the certain interval L of 100 μm to 200 μm may be a value in a range that can entirely offset the above-described disadvantage.

Meanwhile, the third protective layer 140 may be disposed between the first protective layer 120 and the second protective layer 130.

In this way, the third protective layer 140 may be interposed between the first protective layer 120 and the second protective layer 130 to alleviate a step difference between the sheet main body 110 and the sealing portion 160 formed at a side of the sheet main body 110 to seal the sheet main body 110.

In the case of a related art, the first protective layer 120 and the second protective layer 130 should be in contact with each other to form the sealing portion 160 such that the sheet main body 110 is not exposed to the outside. In this case, due to the thickness of the sheet main body 110 itself, the first protective layer 120 and the second protective layer 130 should be deformed obliquely while forming a step difference enough to offset the thickness of the sheet main body 110.

In this case, as the sheet main body 110 becomes thicker, the first protective layer 120 and the second protective layer 130 should be deformed more. The third protective layer 140 may be disposed to alleviate a step difference due to a height difference between the sheet main body 110 and the sealing portion 160.

Herein, alleviating the step difference may mean that the height difference between the sheet main body 110 and the sealing portion 160 is reduced as compared with a case in which there is no third protective layer 140 or may mean that, even when there is no change in the overall height difference between the sheet main body 110 and the sealing portion 160, an environment is provided such that the first protective layer 120 or the second protective layer 130 divides and accommodates the height difference step by step. This will be described in more detail below.

In one embodiment of the present invention, the third protective layer 140 may be interposed between the first protective layer 120 and the second protective layer 130 in various forms.

First, in the magnetic field shielding sheet 100 according to one embodiment of the present invention, the third protective layer 140 may be interposed in a form in which a portion of the third protective layer 140 is exposed to the outside. That is, as shown in FIGS. 1 to 3C, the third protective layer 140 may be disposed such that the first protective layer 120 and the second protective layer 130 are isolated from each other by the third protective layer 140.

As an exemplary example, as shown in FIG. 1, shapes and areas formed by outer edges of the first to third protective layers 120 to 140 may be the same, and thus the first to third protective layers 120 to 140 may be stacked such that the outer edges are not misaligned with each other in a thickness direction.

However, the present invention is not limited thereto, and for example, in addition to the illustrated example, the first to third protective layers 120 to 140 may have various shapes and areas in such a manner that the first protective layer 120 or the second protective layer 130 has a smaller area than the third protective layer 140 and is in contact with the third protective layer 140.

Figure 3A:
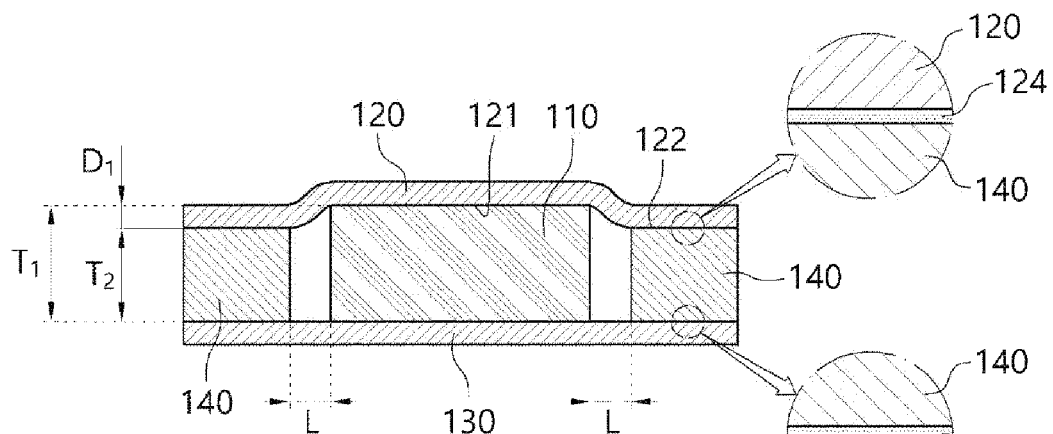
FIGS. 3A-3C show cross-sectional views of FIG. 1.
Figure 3B:
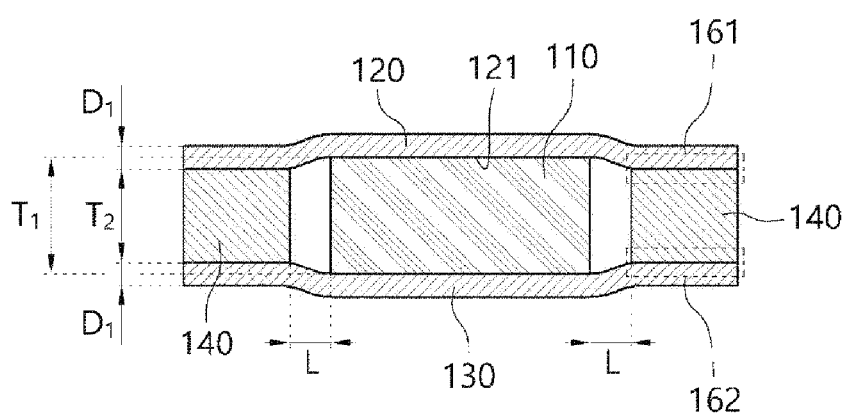
Figure 3C:
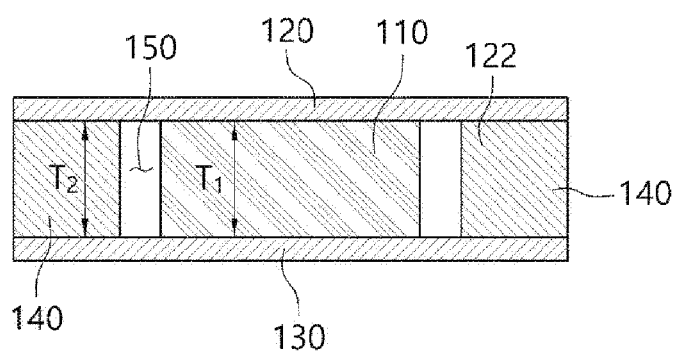
Figure 4:
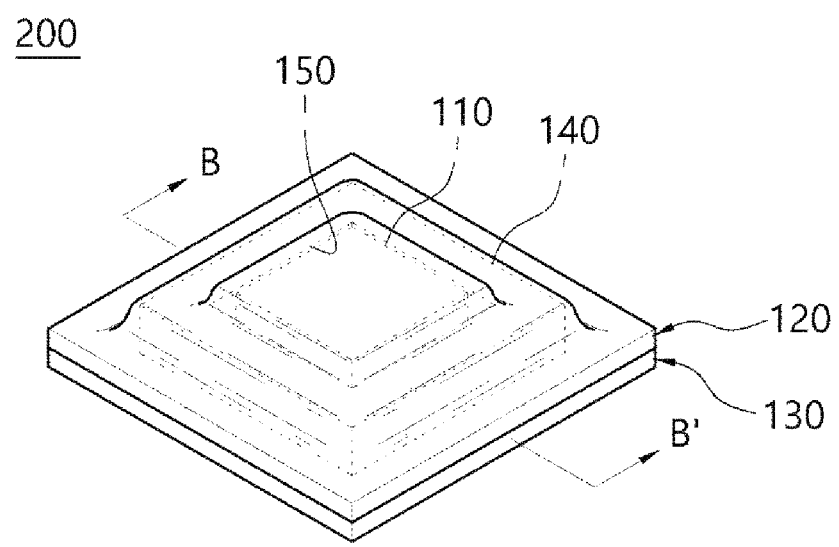
FIG. 4 is a view illustrating a magnetic field shielding sheet according to one embodiment of the present invention.

In this case, referring to FIGS. 3A-3C, the sealing portion 160 for physically sealing the sheet main body 110 to not be exposed to the outside may be formed between the first protective layer 120 and the third protective layer 140 and between the second protective layer 130 and the third protective layer 140.

Specifically, a portion of the first protective layer 120 and a portion of the third protective layer 140 may be bonded to each other by the above-described first adhesive layer 124 to form a first sealing portion 161, and a portion of the second protective layer 130 and a portion of the third protective layer 140 may be bonded to each other by the second adhesive layer 134 to form a second sealing portion 162. Thus, the sheet main body 110 can maintain a sealed state in which communication with the outside is completely blocked.

Meanwhile, in one embodiment of the present invention, a thickness T2 of the third protective layer may be less than a thickness of the sheet main body 110. Accordingly, as shown in FIGS. 3A and 3B, a first step difference D1 less than the thickness of the sheet main body 110 may be formed between the first region 121 and the second region 122 of the first protective layer 120.

Unlike this, the thickness T2 of the third protective layer may be equal to a thickness T1 of the sheet main body. In this case, as shown in FIG. 3C, the first step difference D1 may not be formed between the first region 121 and the second region 122, and the first protective layer 120 and the second protective layer 130 may be disposed parallel to each other. Accordingly, the first protective layer 120 or the second protective layer 130 of the magnetic field shielding sheet 100 can be prevented from being deformed by the first step difference D1, thereby ensuring higher durability and improving the sealing force of the first sealing portion 161.

In this way, in the magnetic field shielding sheet 100 according to one embodiment of the present invention, the third protective layer 140 having a thickness less than or equal to the thickness T1 of the sheet main body is interposed between the first protective layer 120 and the second protective layer 130, thereby compensating for a step difference due to the thickness T1 of the sheet main body to alleviate the excessive deformation of the first protective layer 120. In addition, as a result, the first protective layer 120 and the second protective layer 130 may not be in contact with each other to form the sealing portion 160, but the sealing portion 160 may be formed on each of an upper portion and a lower portion of the third protective layer 140, thereby reducing the area of the magnetic field shielding sheet 100.

More specifically, when the third protective layer 140 is absent, in order to seal the sheet main body 110, the first protective layer 120 disposed on the upper side of the sheet main body 110 and the second protective layer 130 disposed on the lower side of the sheet main body 110 should be in contact with each other to form a sealing portion.

In this case, in order to offset the thickness T1 of the sheet main body, the first protective layer 120 and the second protective layer 130 are deformed to form a sharp slope or are required to have an area large enough to form a gentle slope.

In particular, when the sheet main body 110 is thick and thus the first protective layer 120 and the second protective layer 130 should be more sharply deformed, since a restoring force to restore the original state is excessively increased, an excellent sealing force cannot be secured between the first protective layer 120 and the second protective layer 130.

In comparison, in the magnetic field shielding sheet 100 according to one embodiment of the present invention, the sealing portion 160 may be formed on each of the upper portion and the lower portion of the third protective layer 140, thereby compensating for the step difference due to the thickness T1 of the sheet main body.

Accordingly, the deformation of the first protective layer 120 and the second protective layer 130 can be alleviated, and an excellent sealing force can be secured only with the first protective layer 120 and the second protective layer 130 having a relatively small area.

Next, as another example in which the third protective layer 140 is interposed, in the magnetic field shielding sheet 100' according to one embodiment of the present invention, as shown in FIGS. 4 to 6B, the third protective layer 140 may be disposed to be sealed by the first protective layer 120 and the second protective layer 130 such that the third protective layer 140 is not exposed to the outside together with the sheet main body 110.

In this case, the first protective layer 120 and the second protective layer 130 may have a relatively larger area than the third protective layer 140 to sufficiently cover the upper and lower portions of the third protective layer 140.

In this case, the sealing portion 160 for physically sealing the sheet main body 110 to not be exposed to the outside may be a third sealing portion 163 formed by bonding a portion of the first protective layer 120 and a portion of the second protective layer 130 to each other outside a periphery of the third protective layer 140.

In this case, the third sealing portion 163 may be formed entirely along outer edges of the first protective layer 120 and the second protective layer 130.

Figure 6A:
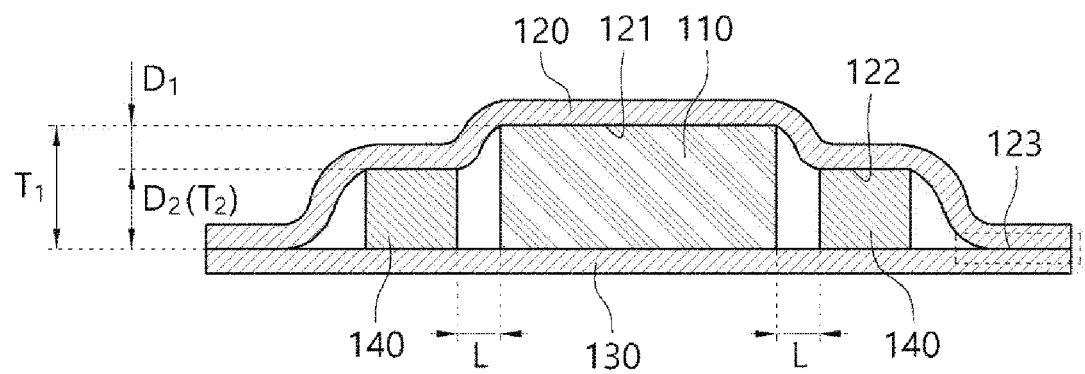
FIGS. 6A-6B show cross-sectional views of FIG. 4.
Figure 6B:
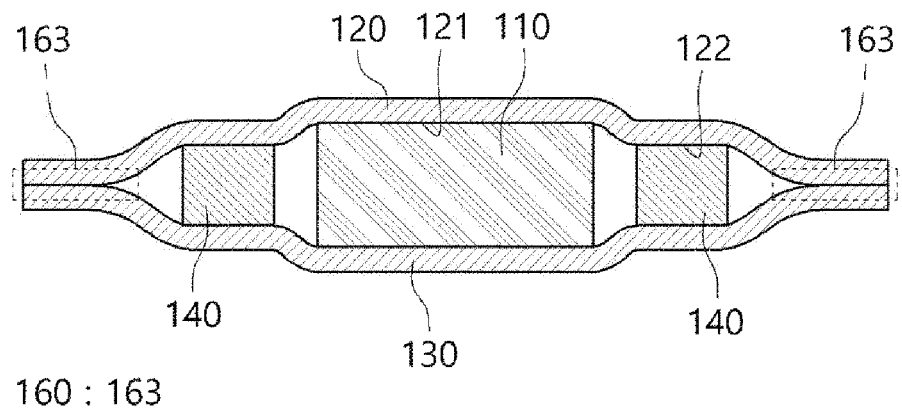

In this case, referring to FIGS. 6A-6B, in addition to the first step difference D1 formed between the first region 121 and the second region 122 of the first protective layer 120, a second step difference D2 may be additionally formed between the second region 122 and the third region 123 of the first protective layer 120.

In this case, like the first step difference D1, the second step difference D2 may be less than the thickness T1 of the sheet main body, and the sum of the first step difference D1 and the second step difference D2 may be equal to the thickness T1 of the sheet main body Accordingly, in the magnetic field shielding sheet 100' according to one embodiment of the present invention, the step difference due to the thickness T1 of the sheet main body may be divided into the first step difference D1 and the second step difference D2 and accommodated step by step. That is, the first protective layer 120 or the second protective layer 130 may primarily accommodate deformation caused by the first step difference D1 from the first region 121 to the second region 122 and then may secondarily accommodate deformation due to the second step difference D2 from the second region 122 to the third region 123.

In this case, since the first step difference D1 and the second step difference D2 are relatively gentle as compared with the thickness of the sheet main body, the deformation of the first protective layer 120 or the second protective layer 130 can be minimized. As a result, in the magnetic field shielding sheet 100' according to one embodiment of the present invention, a sufficient sealing force can be secured only with the first protective layer 120 or the second protective layer 130 having a relatively small area.

Meanwhile, the magnetic field shielding sheet 200 according to another embodiment of the present invention may include the third protective layer 140 that does not include the hollow portion 150.

Figure 7:
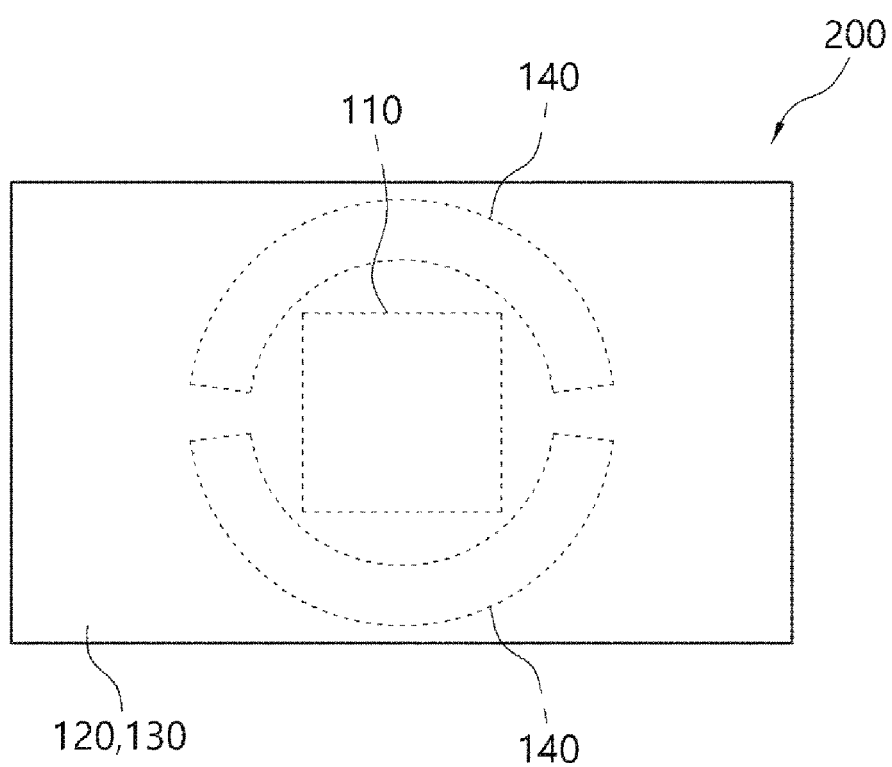
FIG. 7 is a plan view of a magnetic field shielding sheet according to another embodiment of the present invention.

In this case, as shown in FIG. 7, the third protective layer 140 may be formed to cover only a portion of the entire side surface 130 of the sheet main body 110. That is, unlike the third protective layer 140 of the above-described magnetic field shielding sheet 100 or 100' which is formed in a flat plate shape and includes the separate hollow portion 150 therein, the third protective layer 140, which has a certain volume and is integrally connected without a separate hollow portion, may be disposed adjacent to the side surface 113 of the sheet main body 110.

As an example, as shown in FIG. 7, the third protective layer 140 may be applied to a magnetic field shielding sheet having a rectangular structure of which a length in a horizontal direction and a length in a vertical direction are different from each other.

Preferably, as shown in the drawing, the third protective layer 140 may be disposed in a short-length side, in which a length is short so that it is difficult for the first protective layer 120 and the second protective layer 130 to come in contact with each other and form a sealing portion, of the horizontal direction or the vertical direction to alleviate a step difference the sheet main body 110.

In addition, as shown in the drawing, a plurality of third protective layers 140 may be disposed to be spaced apart from each other along a periphery of the sheet main body 110.

In another embodiment of the present invention, the thickness of the third protective layer 140 may be less than or equal to the thickness T1 of the sheet main body, and accordingly, the first step difference D1 or the second step difference D2 may be formed in the first protective layer 120 or the second protective layer 130 similar to the above-described magnetic field shielding sheet 100 or 100'.

Meanwhile, the magnetic field shielding sheet 200 according to another embodiment of the present invention differs from the above-described magnetic field shielding sheets 100 and 100' only in the structure of the third protective layer 140, and the first protective layer 120 and the second protective layer 130 may be provided in the form of a plate-shaped film like the above-described magnetic field shielding sheets 100 and 100', and thus redundant descriptions thereof will be omitted.

The above-described magnetic field shielding sheets 100, 100', and 200 may be manufactured through the following manufacturing method.

Referring to FIG. 8, a method S10 of manufacturing a magnetic field shielding sheet according to one embodiment of the present invention may include the first to fifth operations S11 to S15.

In this case, the first operation S11 may be an operation of arranging one or more sheet main bodies 110 on a base substrate 10 having a plate shape.

Herein, the base substrate 10 is for temporarily arranging the sheet main body 110 before forming the first to third protective layers 120 to 140 around the sheet main body 110. The base substrate 10 may have a relatively large area such that the plurality of sheet main bodies 110 may be disposed to be spaced apart from each other.

In this case, the base substrate 10 may be a known plate-shaped member used in a manufacturing process of a magnetic field shielding sheet, and as an example, an adhesive surface thereof bonded to the sheet main body 110 may be made of a material such as silicone or rubber. Thus, the base substrate 10 may apply a certain magnitude of frictional force to one surface of the sheet main body 110 to maintain a stable state while the sheet main body 110 is temporarily placed.

Figure 9:
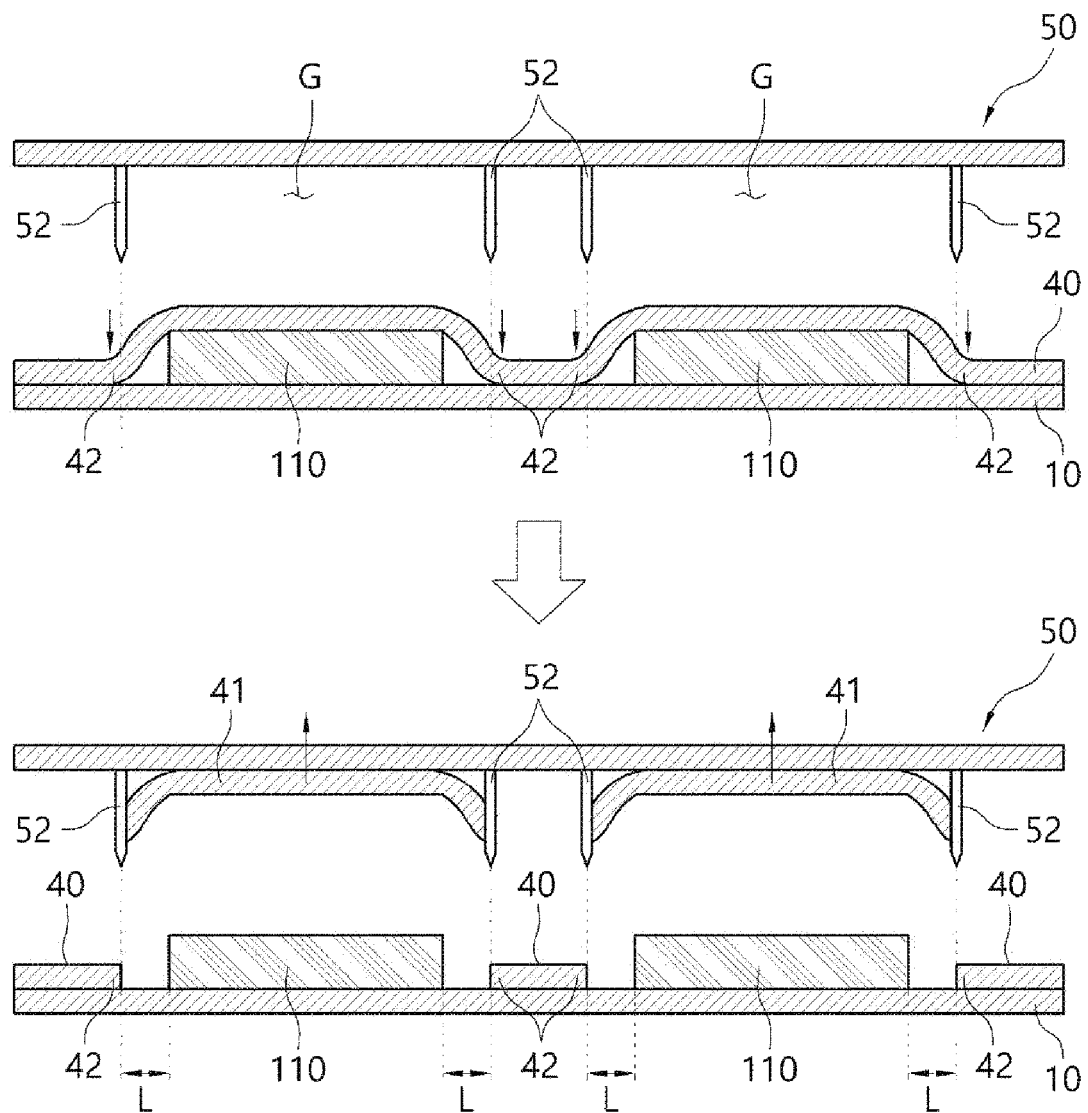
FIGS. 9 and 10 show schematic views illustrating a blanking process using a mold in a method of manufacturing a magnetic field shielding sheet according to one embodiment of the present invention.

Next, the second operation S12 may be an operation of arranging a third sealant 40 on the base substrate 10, on which one or more sheet main bodies 110 are disposed, such that the sheet main body 110 is embedded (see FIG. 9).

In this case, the third sealant 40 is for forming the above-described third protective layer 140 and is made of the same material as the third protective layer 140. As an example, the third sealant 40 may be formed in a plate shape with an area corresponding to the base substrate 10.

Meanwhile, when the third sealant 40 having the plate shape is disposed on the base substrate 10, as shown in the drawing, a portion of the third sealant 40 may be in close contact with one surface of the sheet main body 110, and another portion thereof surrounding the sheet main body 110 may be in close contact with the base substrate 10. Accordingly, a curvature may be formed locally in the third sealant 40 by the sheet main body 110 protruding from the base substrate 10.

As shown in FIG. 9, the third operation S13 may be an operation of blanking and removing a portion of the third sealant 40 adjacent to the sheet main body 110. Thus, the above-described third protective layer 140 may be formed around a side surface of the sheet main body 110.

Figure 11:
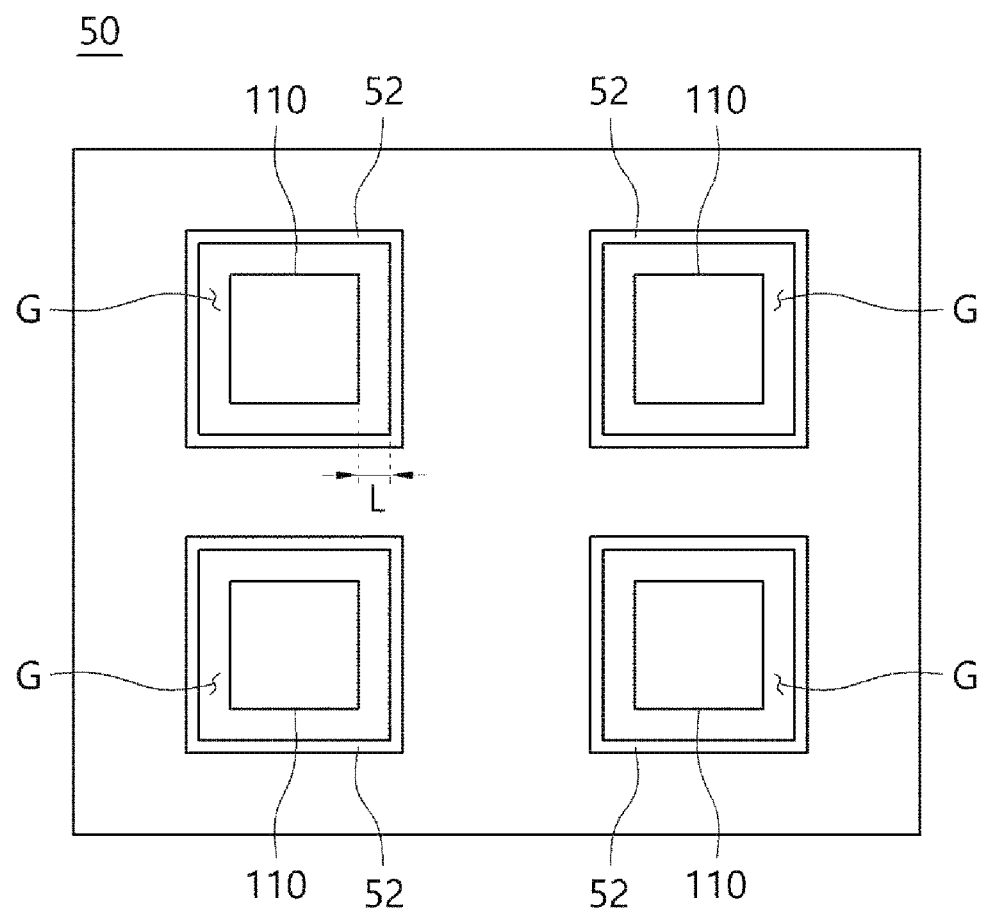
FIG. 11 is a schematic view illustrating a mold that can be used to manufacture a magnetic field shielding sheet according to one embodiment of the present invention.
Figure 12:
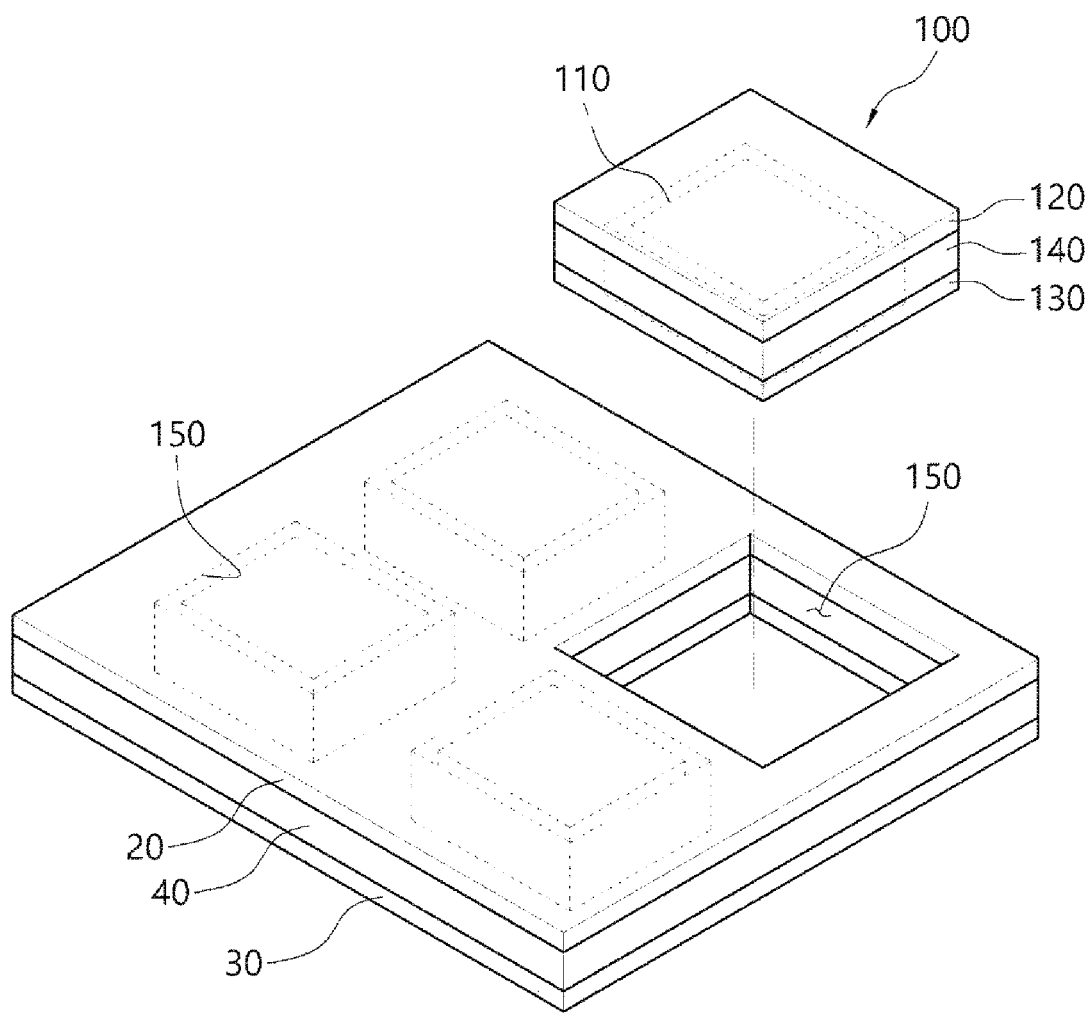
FIG. 12 is a schematic view illustrating a process in which a magnetic field shielding sheet is finally blanked and manufactured according to one embodiment of the present invention.

Specifically, a blanking process may be performed by a mold 50 shown in FIG. 11. In this regard, as shown in the drawing, the mold 50 may include a cutting blade 52 which forms a hollow portion G with a shape corresponding to the sheet main body 110 and is disposed to surround the sheet main body 110.

In this case, the area of the hollow portion G formed by the cutting blade 52 may be greater than the area of the sheet main body 110. This is to separate the third protective layer 140 from the sheet main body 110 by a certain interval L to ensure a spare tolerance in preparation for manufacturing errors that may occur during the blanking process.

Meanwhile, a separation piece 41 separated from the third sealant 40 after the blanking may be removed while being attached to the mold 50. In the third sealant 40 that remains in close contact with the base substrate 10, a portion 42 cut by the cutting blade 52 may be initially positioned while lifted and spaced apart from the base substrate 10 and then may be moved toward the base substrate 10 by gravity after the blanking process to remain in close contact with the base substrate 10.

Figure 10:
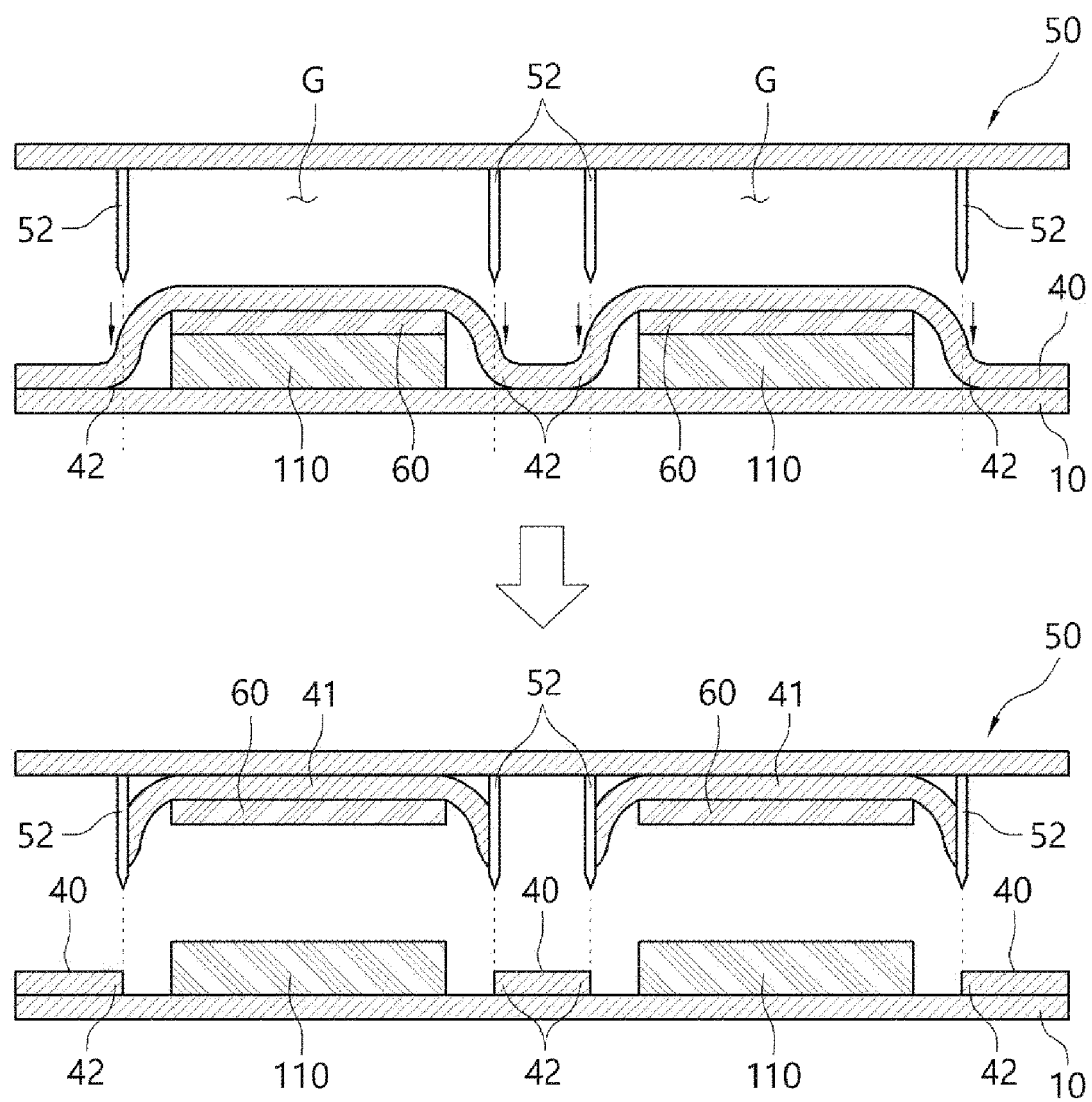

Referring to FIG. 10, before performing the second operation S12 after the first operation S11, the method may further include an operation of arranging a removable release film 60 on the sheet main body 110. In this case, the release film 60 is for more easily removing the separation piece 41 in the above-described third operation S13, and to the this end, an adhesive layer may be applied on a portion of the release film 60 that is in close contact with the mold 50.

Subsequently, the fourth operation S14 may be an operation of arranging a first sealant 20 having a plate shape on the sheet main body 110 and the third sealant 40 from which the separation piece 41 is removed.

In this case, the first sealant 20 is for forming the first protective layer 120 and may be a plate-shaped film made of the same material as the first protective layer 120.

In addition, the above-described first adhesive layer 124 may be formed on one surface of the first sealant 20 and thus may be bonded to a second sealant 30 or the third sealant 40 to form the above-described sealing portion 160.

To this end, the first sealant 20 may be formed, for example, as a protective film in which an adhesive is applied on one surface (single-sided protective film) or a protective film in which an adhesive is applied on two surfaces (double-sided protective film). In this way, when the first sealant 20 is formed as a double-sided protective film, a finally manufactured magnetic field shielding sheet can be easily attached at a position adjacent to an antenna unit.

The fifth operation S15 may be an operation of removing the above-described base substrate 10 and arranging the second sealant 30 in place of the base substrate 10.

In this case, the second sealant 30 may be for forming the second protective layer 130. The second sealant 30 may differ from the first sealant 20 only in arrangement position, may be made of the same or similar material to the first sealant 20, and may perform the same function as the first sealant 20. Accordingly, like the first sealant 20, the second sealant 30 may be formed as a single-sided protective film or a double-sided protective film.

Meanwhile, for convenience of work, the fifth operation S15 may be performed after inverting the top and bottom in a state in which the fourth operation S14 is performed.

Finally, the method S10 of manufacturing a magnetic field shielding sheet according to one embodiment of the present invention may further include the sixth operation S16 of blanking the first to third sealants 20 to 40 according to the design standard of a magnetic field shielding sheet in a state in which the first sealant 20 and the second sealant 30 are disposed as described above.

However, in the sixth operation S16, when the first protective layer 120 or the second protective layer 130 has both the first step difference D1 and the second step difference D2, only the first sealant 20 and second sealant 30 excluding the third sealant 40 may be blanked.

In this case, the blanking process may be performed using a mold (not shown) including a blade (not shown) having a hollow portion with a size corresponding to a certain design standard of a magnetic field shielding sheet. Herein, the mold is provided with a plurality of blades spaced apart from each other, thereby manufacturing a plurality of magnetic field shielding sheets through one blanking process.

The magnetic field shielding sheets 100, 100, and 200 finally manufactured as described above may be formed in a state in which the sheet main body 110 is completely sealed by the first to third sealants 20 to 40.

Although embodiments of the present embodiment have been described, the technical ideas of the present invention are not restricted to the embodiments described herein, and it shall be appreciated that those having ordinary skill in the art who understand the present invention can propose other embodiments by supplementing, modifying, deleting, and adding elements within the same technical ideas, but this shall also belong to the technical ideas of the present invention.

What is claimed is:

1. A magnetic field shielding sheet, comprising:
   a sheet main body made of a magnetic material to shield a magnetic field;
   a first protective layer disposed to cover a first surface of the sheet main body;
   a second protective layer disposed to cover a second surface of the sheet main body, wherein the second surface is opposite to the first surface;
   a third protective layer interposed between the first protective layer and the second protective layer to cover a side surface of the sheet main body in a thickness direction of the sheet main body; and
   a sealing portion formed at a side portion of the sheet main body to seal the sheet main body;
   wherein a step difference formed between the sheet main body and the sealing portion is formed to be alleviated by the third protective layer.

2. The magnetic field shielding sheet of claim 1, wherein the third protective layer comprises a hollow portion, wherein the hollow portion is formed for the sheet main body to be disposed in an inner region of the hollow portion.

3. The magnetic field shielding sheet of claim 2, wherein the hollow portion is formed in a shape corresponding to a shape of the sheet main body, and
   a certain interval is formed between the side surface of the sheet main body and a boundary surface of the hollow portion.

4. The magnetic field shielding sheet of claim 3, wherein the certain interval is in a range of 100 μm to 200 μm.

5. The magnetic field shielding sheet of claim 1, wherein the first protective layer, the second protective layer and the third protective layer are stacked such that outer edges are not misaligned with each other in the thickness direction.

6. The magnetic field shielding sheet of claim 1, wherein the sealing portion comprises a first sealing portion formed by a portion of the first protective layer and a first portion of the third protective layer being in contact with each other, and a second sealing portion formed by a portion of the second protective layer and a second portion of the third protective layer being in contact with each other.

7. The magnetic field shielding sheet of claim 1, wherein the sealing portion comprises a third sealing portion formed by a portion of the first protective layer and a portion of the second protective layer being in contact with each other outside the third protective layer, and
   the sheet main body and the third protective layer are sealed by the third sealing portion to not be exposed to an outside.

8. The magnetic field shielding sheet of claim 1, wherein a thickness of the third protective layer is less than a thickness of the sheet main body.

9. The magnetic field shielding sheet of claim 8, wherein a first step difference is formed between a first region in which the first protective layer is in contact with the sheet main body and a second region in which the first protective layer is in contact with the third protective layer.

10. The magnetic field shielding sheet of claim 9, wherein a second step difference is formed between the second region and a third region in which the first protective layer is in contact with the second protective layer.

11. The magnetic field shielding sheet of claim 1, wherein a thickness of the third protective layer is equal to a thickness of the sheet main body, and
    the first protective layer and the second protective layer are disposed parallel to each other.

12. The magnetic field shielding sheet of claim 1, wherein the third protective layer is disposed to cover only a partial side surface of an entire side surface of the sheet main body.

13. A magnetic field shielding sheet, comprising:
    a sheet main body made of a magnetic material to shield a magnetic field;
    a first protective layer disposed to cover a first surface of the sheet main body;
    a second protective layer disposed to cover a second surface of the sheet main body, wherein the second surface is opposite to the first surface;
    a third protective layer disposed between the first protective layer and the second protective layer to cover a side surface of the sheet main body; and
    a sealing portion formed on a side portion of the sheet main body to seal the sheet main body;
    wherein the third protective layer comprises a hollow portion formed for the sheet main body to be disposed in an inner region of the hollow portion,
    a thickness of the third protective layer is less than or equal to a thickness of the sheet main body, and
    a step difference formed between the sheet main body and the sealing portion is formed to be alleviated by the third protective layer.

14. A method of manufacturing a magnetic field shielding sheet, wherein the magnetic field shielding sheet comprises a first protective layer and a second protective layer, each surrounding the sheet main body, and a third protective layer between the first protective layer and the second protective layer, and the method comprises:
    a first operation of arranging one or more sheet main bodies on a base substrate having a plate shape;
    a second operation of arranging a third sealant for forming the third protective layer on the base substrate such that the one or more sheet main bodies are embedded;
    a third operation of removing one region of the third sealant adjacent to the one or more sheet main bodies;
    a fourth operation of arranging a first sealant for forming the first protective layer on the one or more sheet main bodies and the third sealant; and
    a fifth operation of removing the base substrate and arranging a second sealant for forming the second protective layer in place of the base substrate.

15. The method of claim 14, wherein the first sealant is formed as a protective film with an adhesive applied on one surface, and
    the second sealant is formed as a protective film with an adhesive applied on two surfaces.

16. The method of claim 14, further comprising, after the first operation, arranging a removable release film on the sheet main body.

17. The method of claim 14, wherein the third operation comprises performing blanking with a mold comprising a cutting blade having a hollow portion with a shape corresponding to the sheet main body, and
    an area of the hollow portion is greater than an area of the sheet main body such that the cutting blade is spaced apart from the sheet main body by a certain interval.

18. The method of claim 14, further comprising a sixth operation of blanking the first sealant and the second sealant according to a certain design standard of a magnetic field shielding sheet in a state in which the first sealant and the second sealant are disposed.

\* \* \* \* \*